United States Patent
Liu et al.

(10) Patent No.: US 11,056,195 B1
(45) Date of Patent: Jul. 6, 2021

(54) NONVOLATILE MEMORY DEVICE AND RELATED DRIVING METHOD

(71) Applicant: MACRONIX INTERNATIONAL CO., LTD., Hsinchu (TW)

(72) Inventors: Yi-Ching Liu, Hsinchu (TW); Chin-Ming Yang, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/858,813

(22) Filed: Apr. 27, 2020

(51) Int. Cl.
| | |
|---|---|
| G11C 16/08 | (2006.01) |
| G11C 16/04 | (2006.01) |
| G11C 16/24 | (2006.01) |
| G11C 29/44 | (2006.01) |
| G11C 16/26 | (2006.01) |
| G11C 16/10 | (2006.01) |
| G11C 16/14 | (2006.01) |

(52) U.S. Cl.
CPC .......... *G11C 16/24* (2013.01); *G11C 16/0483* (2013.01); *G11C 16/08* (2013.01); *G11C 16/10* (2013.01); *G11C 16/14* (2013.01); *G11C 16/26* (2013.01)

(58) Field of Classification Search
CPC ......... G11C 16/24; G11C 16/08; G11C 16/10; G11C 16/14; G11C 16/26; G11C 16/0483
See application file for complete search history.

(56) References Cited

U.S. PATENT DOCUMENTS

| | | | |
|---|---|---|---|
| 7,715,235 B2 * | 5/2010 | Cernea | G11C 16/0483 365/185.19 |
| 10,553,283 B2 | 2/2020 | Deguchi et al. | |
| 2010/0046297 A1 * | 2/2010 | Cernea | G11C 16/10 365/185.18 |
| 2019/0295669 A1 | 9/2019 | Yang et al. | |
| 2020/0342940 A1 * | 10/2020 | Roy | G11C 16/0433 |

FOREIGN PATENT DOCUMENTS

TW 201947597 A 12/2019

OTHER PUBLICATIONS

Mario Sako et al., "A Low-Power 64Gb MLC NAND-Flash Memory in 15nm CMOS Technology", IEEE ISSCC Dig. Tech. Papers, pp. 128-129, Feb. 2015.

Chang Siau et al., "A 512Gb 3-bit/Cell 3D Flash Memory on 128-Wordline-Layer with 132MB/s Write Performance Featuring Circuit-Under-Array Technology", IEEE ISSCC Dig. Tech. Papers, pp. 218-219, 2019.

* cited by examiner

*Primary Examiner* — Gene N Auduong
(74) *Attorney, Agent, or Firm* — McClure, Qualey & Rodack, LLP

(57) ABSTRACT

A driving method of a nonvolatile memory device including multiple memory planes includes following operations: precharging at least one word line and at least one bit line of a first memory plane; if the at least one word line and the at least one bit line of the first memory plane have been precharged for a first time length or to respective voltage thresholds, precharging at least one word line and at least one bit line of a second memory plane; conducting a first data operation to at least one memory cell of the first memory plane disposed at intersections of the at least one word line and the at least one bit line thereof; conducting a second data operation to at least one memory cell of the second memory plane disposed at intersections of the at least one word line and the at least one bit line thereof.

18 Claims, 7 Drawing Sheets

NONVOLATILE MEMORY DEVICE AND RELATED DRIVING METHOD

BACKGROUND

Field of Invention

The present disclosure generally relates to a driving method of a nonvolatile memory device. More particularly, the present disclosure relates to a driving method of a nonvolatile memory device capable of mitigating current surge.

Description of Related Art

NAND flash memory is widely used in solid-state drives (SSD), mobile devices, and handheld gaming consoles because of advantages of shock resistance and high transmission speed. The physical structure of the NAND flash memory can be hierarchically divided into memory chips, memory planes, blocks, and physical pages. The current technology simultaneously accesses multiple memory planes to speed up the data transmission speed, but this may cause large current surges in the memory chip, thereby may harm the related power module.

SUMMARY

The disclosure provides a driving method of a nonvolatile memory device including a plurality of memory planes. The driving method includes the following operations: precharging at least one word line and at least one bit line of a first memory plane of the plurality of memory planes; if the at least one word line and the at least one bit line of the first memory plane have been precharged for a first time length or to respective voltage thresholds, precharging at least one word line and at least one bit line of a second memory plane of the plurality of memory planes; conducting a first data operation to at least one memory cell of the first memory plane, and the at least one memory cell of the first memory plane is disposed at intersections of the at least one word line and the at least one bit line of the first memory plane; conducting a second data operation to at least one memory cell of the second memory plane, and the at least one memory cell of the second memory plane is disposed at intersections of the at least one word line and the at least one bit line of the second memory plane.

The disclosure provides a driving method of a nonvolatile memory device including a plurality of memory planes. The driving method includes the following operations: precharging at least one word line and at least one bit line of a first memory plane of the plurality of memory planes; if the at least one word line and the at least one bit line of the first memory plane have been precharged for a second time length shorter than a first time length, precharging at least one word line and at least one bit line of a second memory plane of the plurality of memory planes while continuing precharging the at least one word line and the at least one bit line of the first memory plane; when the at least one word line and the at least one bit line of the first memory plane have been precharged for the first time length, conducting a first data operation to at least one memory cell of the first memory plane, wherein the at least one memory cell of the first memory plane is disposed at intersections of the at least one word line and the at least one bit line of the first memory plane; when the at least one word line and the at least one bit line of the second memory plane have been precharged for the first time period, conducting a second data operation to at least one memory cell of the second memory plane, wherein the at least one memory cell of the second memory plane is disposed at intersections of the at least one word line and the at least one bit line of the second memory plane.

The disclosure provides a nonvolatile memory device including a memory chip and a control circuit. The memory chip includes a plurality of memory planes. The control circuit is coupled with the memory chip, and is adapted to: precharge at least one word line and at least one bit line of a first memory plane of the plurality of memory planes; if the at least one word line and the at least one bit line of the first memory plane have been precharged for a first time length or to respective voltage thresholds, precharge at least one word line and at least one bit line of a second memory plane of the plurality of memory planes; conduct a first data operation to at least one memory cell of the first memory plane, wherein the at least one memory cell of the first memory plane is disposed at intersections of the at least one word line and the at least one bit line of the first memory plane; conduct a second data operation to at least one memory cell of the second memory plane, wherein the at least one memory cell of the second memory plane is disposed at intersections of the at least one word line and the at least one bit line of the second memory plane.

It is to be understood that both the foregoing general description and the following detailed description are by examples, and are intended to provide further explanation of the disclosure as claimed.

DETAILED DESCRIPTION

Figure 1:
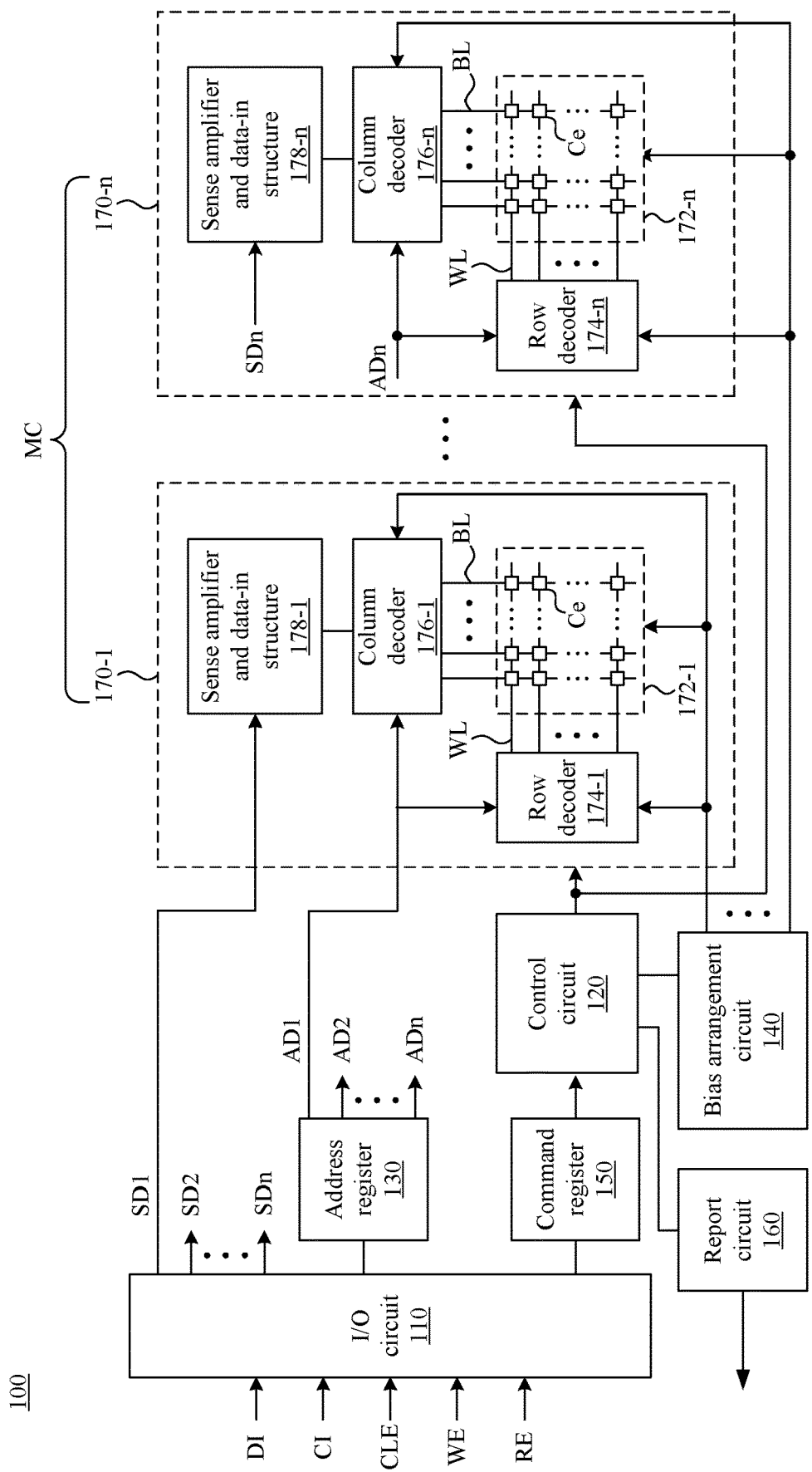
FIG. 1 is a simplified functional block diagram of a nonvolatile memory device according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a nonvolatile memory device 100 according to one embodiment of the present disclosure. The nonvolatile memory device 100 comprises an input and output circuit 110, a control circuit 120, an address register 130, a bias arrangement circuit 140, a command register 150, a report circuit 160, and a memory chip MC, wherein the memory chip MC comprises a plurality of memory planes 170-1~170-n. The memory plane 170 comprises a memory array 172, a row decoder 174, a column decoder 176, and a sense amplifier and data-in structure 178. For the sake of brevity, other functional blocks of the nonvolatile memory device 100 are not shown in FIG. 1.

Throughout the specification and drawings, indexes 1~n may be used in the reference labels of components for ease of referring to respective components. The use of indexes 1~n does not intend to restrict the amount of components to any specific number. In the specification and drawings, if a reference label of a particular component is used without having the index, it means that the reference label is used to refer to any unspecific component of corresponding component group. For example, the reference label 170-1 is used to refer to the specific memory plane 170-1, and the reference label 170 is used to refer to any unspecific memory plane of the memory planes 170-1~170-n. In another example, the reference label 172-1 is used to refer to the specific memory array 172-1, and the reference label 172 is used to refer to any unspecific memory array of the memory arrays 172-1~172-n.

The input and output circuit 110 is configured to determine whether to read a command input CI and a data input DI into the nonvolatile memory device 100, and also configured to determine whether to output data from the sense amplifier and data-in structure 178. For example, the input and output circuit 110 may determine whether to write the command input CI into the command register 150 according to a command latch enable signal CLE. As another example, the input and output circuit 110 may determine whether to read in the data input DI and whether to output data according to a write enable signal WE and a read enable signal RE, respectively.

In addition, the input and output circuit 110 is further configured to write one or more addresses AD1~ADn of the command input CI into the address register 130. The address register 130 is configured to distribute the addresses AD1~ADn to row decoders 174 and column decoders 176 of one or more corresponding memory planes 170. The input and output circuit 110 is also configured to transform the data input DI to one or more to-be-written data SD1~SDn, and configured to distribute the to-be-written data SD1~SDn to one or more corresponding sense amplifiers and data-in structures 178.

The control circuit 120 is coupled with the bias arrangement circuit 140, the command register 150, the report circuit 160, and the memory planes 170-1~170-n. The control circuit 120 is configured to conduct data operations (e.g., programming, reading, and erasing) to the memory plane 170 according to the command input CI. The control circuit 120 is also configured to control output voltages of the bias arrangement circuit 140 according to the command input CI, wherein the bias arrangement circuit 140 is configured to set a plurality of word lines WL and a plurality of bit lines BL of the memory plane 170 to suitable voltages corresponding to a current data operation.

The row decoder 174 and the column decoder 176 are coupled with the memory array 172 through the word lines WL and the bit lines BL, respectively. The row decoder 174 and the column decoder 176 are configured to receive one or more corresponding ones of the addresses AD1~ADn from the address register 130, and also configured to conduct data operation to the memory array 172 according to the received address. In this embodiment, the memory array 172 may comprise a plurality of blocks, each block may comprise a plurality of pages, and each page may comprise a plurality of memory cells. Each memory cell Ce is disposed at an intersection of a corresponding word line WL and a corresponding bit line BL, that is, the control gate of a memory cell Ce is defined by the overlapping area of a corresponding word line WL and a corresponding bit line BL. In addition, the memory array 172 may be realized as a two-dimensional (2D) memory array or a three-dimensional (3D) memory array.

Figure 2:
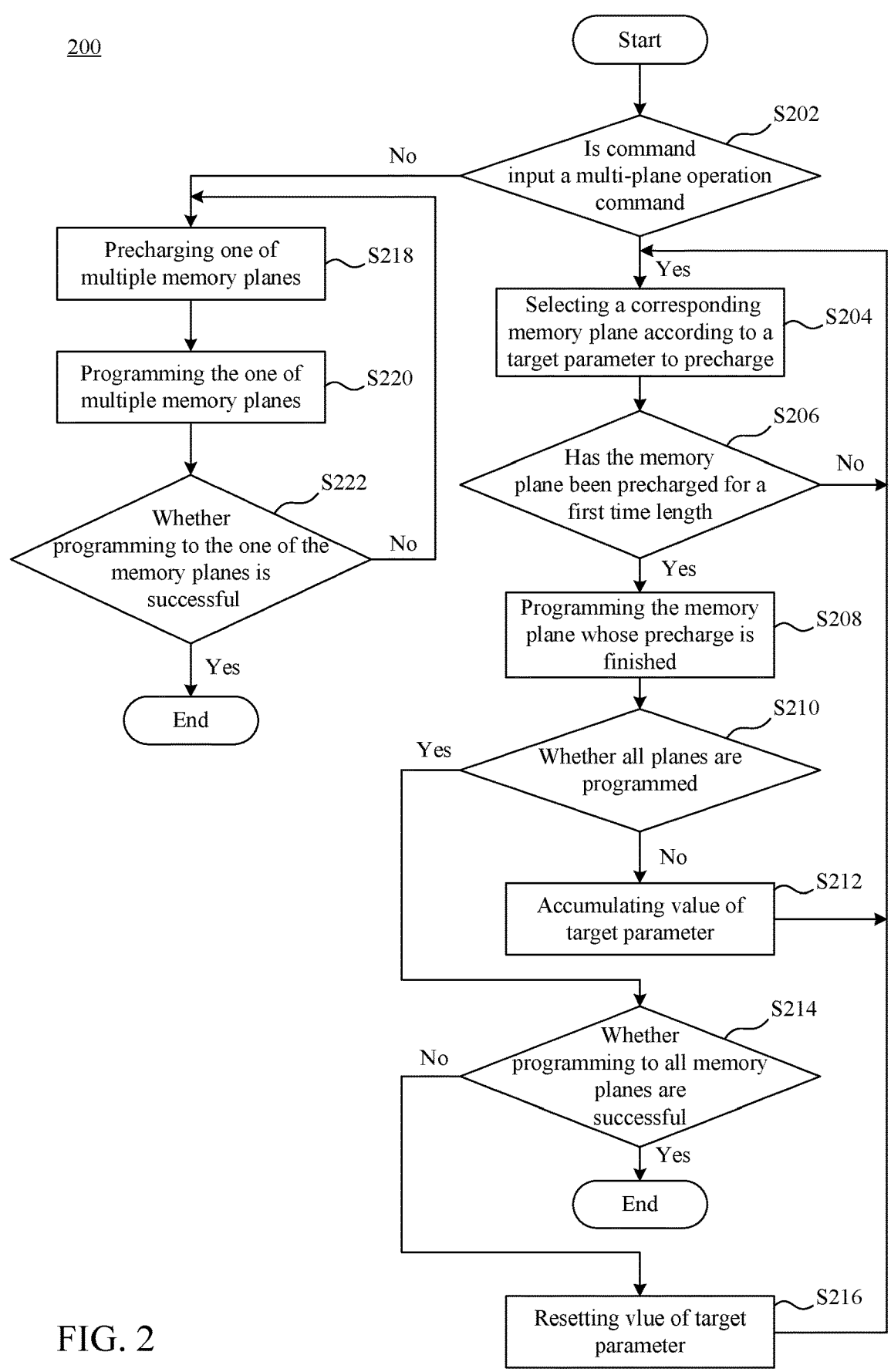
FIG. 2 is a flowchart of a driving method according to one embodiment of the present disclosure.
Figure 3:
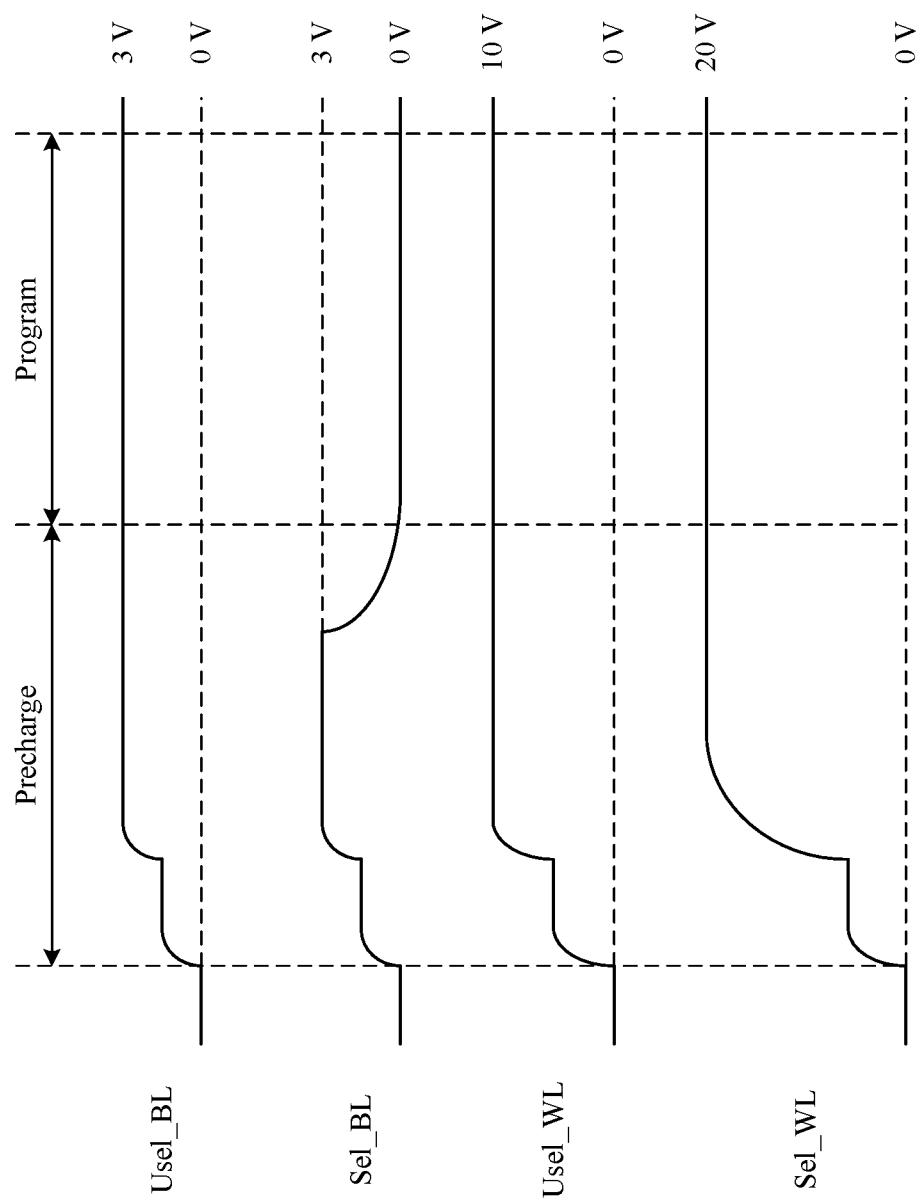
FIG. 3 is a waveform schematic of some of word lines WL and bit lines BL of a memory plane during precharge according to one embodiment of the present disclosure.
Figure 4:
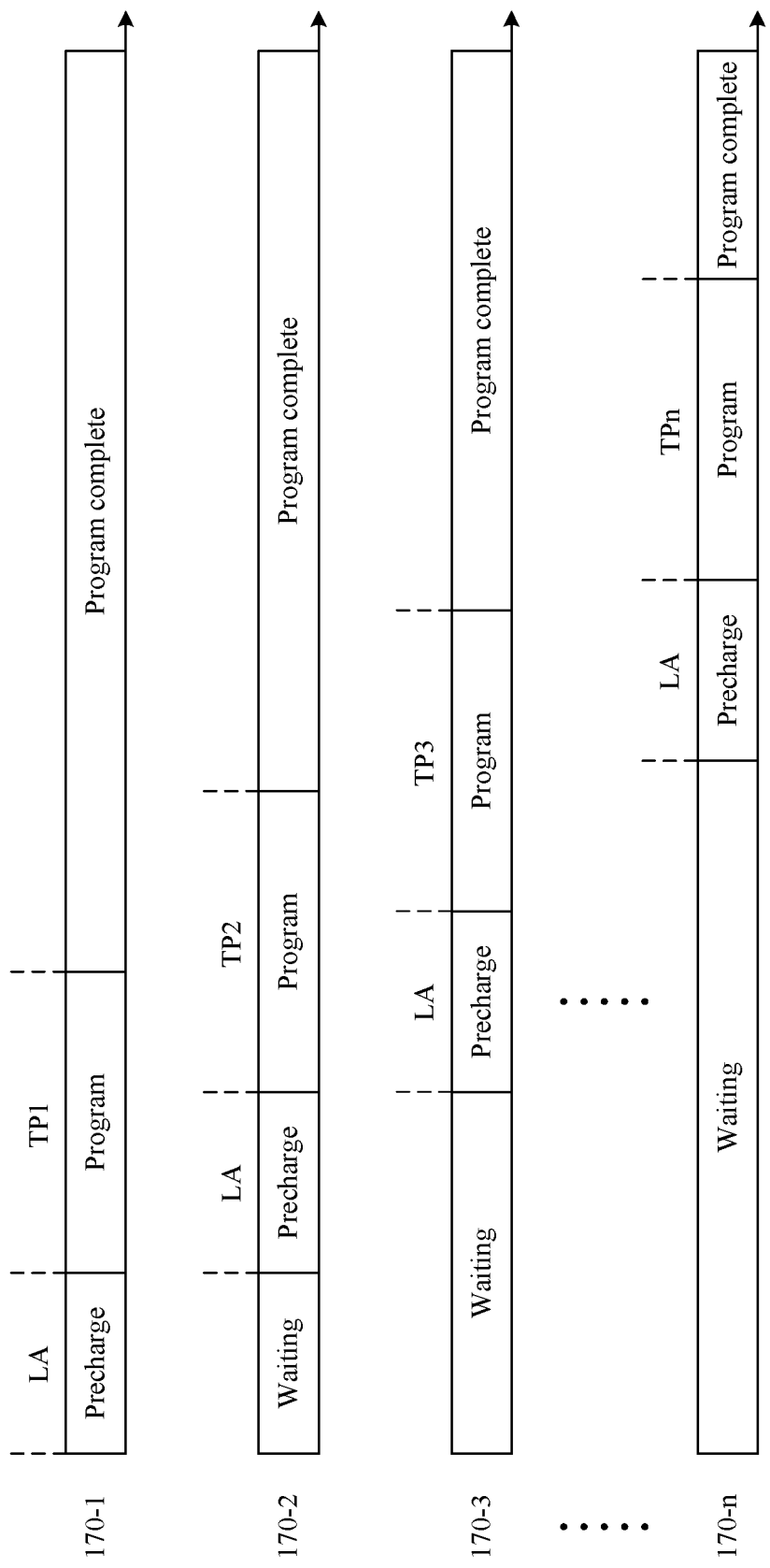
FIG. 4 is a timing diagram for illustrating operations of multiple memory planes according to one embodiment of the present disclosure.

FIG. 2 is a flowchart of a driving method 200 according to one embodiment of the present disclosure. FIG. 3 is a waveform schematic of the word lines WL and the bit lines BL of a memory plane during precharge according to one embodiment of the present disclosure. FIG. 4 is a timing diagram for illustrating operations of the memory planes 170-1~170-n according to one embodiment of the present disclosure. The term precharge in this disclosure means that before corresponding word lines WL and bit lines BL are used for the reading operation, programming operation, or erasing operation, the voltages thereof are set to close to the working voltage required by the reading operation, programming operation, or erasing operation. As the size of the memory array 172 increases, longer word lines WL and bit lines BL may be needed, and precharge is used to partially offset the increased RC delay of the word lines WL and the bit lines BL and to speed up the voltage configuration speed of the memory array 172. Reference is first made to FIG. 2, the nonvolatile memory device 100 may execute the driving method 200 to conduct data operations such as reading, programming, and erasing. For the purpose of explanatory convenience, the driving method 200 will be described with programming operation as an example in the following description. In operation S202, the control circuit 120 determines whether the command input CI is a multi-plane operation command. If command input CI is the multi-plane operation command, the nonvolatile memory device 100 conducts operations S204~S216. On the contrary, the nonvolatile memory device 100 conducts operations S218~S222.

In operation S204, the control circuit 120 may select a corresponding one of the memory planes 170-1~170-n according to a target parameter to precharge at least one word line WL and at least one bit line BL thereof, wherein the target parameter may be stored in the nonvolatile memory device 100 in advance. For example, when the target parameter is 1, the control circuit 120 may control the bias arrangement circuit 140 to precharge the memory plane 170-1. In this disclosure, the wording precharge refers to setting corresponding word lines WL and bit lines BL to suitable and stable voltages, so as to prevent operation failure caused by parasitic elements on the word lines WL and the bit lines BL. For example, as shown in FIG. 3, when the memory plane 170 is precharged, the control circuit 120 may raise the at least one word line WL and the at least one bit line BL of the memory plane 170 to corresponding voltages. For the sake of brevity, FIG. 3 only shows waveform of an unselected bit line Usel_BL being applied with an inhibit voltage (e.g., 3 V), waveform of a selected bit line Sel_BL first being applied with the inhibit voltage and then being applied with the ground voltage (e.g., 0 V), waveform of an unselected word line Usel_WL being applied with a passing voltage (e.g., 10 V), and waveform of a selected word line Sel_WL being applied with a programming voltage (e.g., 20 V).

The voltages provided to the word lines WL and the bit lines BL by the bias arrangement circuit 140 may have stepped waveforms as shown in FIG. 3, or may have square waveforms. In some embodiments, the control circuit 120 may use an external power source (not shown) having greater power to respectively charge the word lines WL and the bit lines BL to the first step of the stepped waveform thereof to accelerate the charging speed, however, this disclosure is not limited thereto. In other embodiments, the control circuit 120 may use the bias arrangement circuit 140 to charge the word lines WL and the bit lines BL during the whole precharge process without using the external power source.

Reference is made to FIG. 4, in operation S206, the control circuit 120 determines whether the memory plane 170 currently being precharged (e.g., memory plane 170-1) has been precharged for a first time length LA. When the memory plane 170 currently being precharged has been precharged for the first time length LA, the control circuit 120 determines that the precharge is finished and the nonvolatile memory device 100 then conduct operation S208 to program the at least one memory cell Ce disposed at intersections of the at least one word line WL and the at least one bit line BL of the memory plane 170 whose precharge is finished (e.g., the memory plane 170-1). On the contrary, the nonvolatile memory device 100 may conduct operation S204 again.

In operation S210, the control circuit 120 determines whether all of the memory planes 170-1~170-$n$ are programmed. The control circuit 120 may, for example, determine whether the target parameter is smaller than a total number of the memory planes 170-1~170-$n$. If not all of the memory planes 170 are programmed, the nonvolatile memory device 100 conducts operation S212 to accumulate value of the target parameter, such as setting the target parameter to the target parameter plus one. The nonvolatile memory device 100 may conduct operation S204 again when operation S212 is finished. In this situation, the control circuit 120 selects other corresponding one of the memory planes 170-1~170-$n$ (e.g., the memory plane 170-2) to precharge at least one word line WL and at least one bit line BL thereof.

In this embodiment, operation S208 may be conducted with operations S210~S212 and other operations conducted after operation S212. Reference is made to FIG. 4, when the memory plane 170-1 is programmed after precharge is finished, the control circuit 120 may control the memory plane 170-2 to start to be precharged. When the memory plane 170-2 is programmed after precharge is finished, the control circuit 120 may control the memory plane 170-3 to start to be precharged in a situation that the memory plane 170-1 and/or the memory plane 170-2 are still being programmed.

In other words, since the memory planes 170-1~170-$n$ would not be precharged simultaneously, the driving method 200 is helpful to reduce current surges in the nonvolatile memory device 100.

In addition, programming operations of multiple ones of the memory planes 170-1~170-$n$ may be conducted in parallel, that is, multiple ones of programming time periods TP1~TP$n$ corresponding to programming operations of the memory planes 170-1~170-$n$ may be at least partially overlapping with each other. Therefore, the driving method 200 is helpful to accelerate programming speed of the nonvolatile memory device 100.

Reference is made to FIG. 2 again, in operation S214, the control circuit 120 determines whether the programming operations to all of the memory planes 170-1~170-$n$ are successful. For example, in some embodiments, the nonvolatile memory device 100 uses the incremental-step-pulse programming (ISPP) technology to program, and the control circuit 120 may determine whether a programming operation is successful based on a total number of programming pulses provided to a target word line WL. If the control circuit 120 determines that the programming operations to all of the memory planes 170-1~170-$n$ are successful, the control circuit 120 may use the report circuit 160 to output a signal representing programming success to an external processor or an external logic circuit (not shown in figure) and finish executing the driving method 200. On the contrary, the nonvolatile memory device 100 may conduct operation S216 to reset the target parameter, and then conduct operation S204 again. For example, the nonvolatile memory device 100 may reset the target parameter to 1 in operation S216 so that the memory planes 170-1~170-$n$ will be re-programmed from memory plane 170-1 in the following operations.

When the command input CI is not a multi-plane operation command, the nonvolatile memory device 100 conducts operation S218 to precharge at least one word line WL and at least one bit line BL of one of the memory planes 170-1~170-$n$. Then, when precharging for the first time length LA, the nonvolatile memory device 100 conducts operation S220 to program at least one memory cell Ce of the one of the memory planes 170-1~170-$n$.

Operation S222 is similar to operation S214. In operation S222, the control circuit 120 determines whether programming operation to the one of the memory planes 170-1~170-$n$ is successful. If the control circuit 120 determines that programming operation to the one of the memory planes 170-1~170-$n$ is successful, the nonvolatile memory device 100 finishes executing driving method 200. On the contrary, the nonvolatile memory device 100 may conduct operation S218 again.

In some embodiments, when the nonvolatile memory device 100 executes the driving method 200 to read the memory chip MC, the nonvolatile memory device 100 may conduct reading operation in operation S208 and operation S220 rather than conducting programming operation. Similarly, in other embodiments, when the nonvolatile memory device 100 executes the driving method 200 to erase the memory chip MC, the nonvolatile memory device 100 may conduct erasing operation in operation S208 and operation S220 rather than conducting programming operation.

Figure 5:
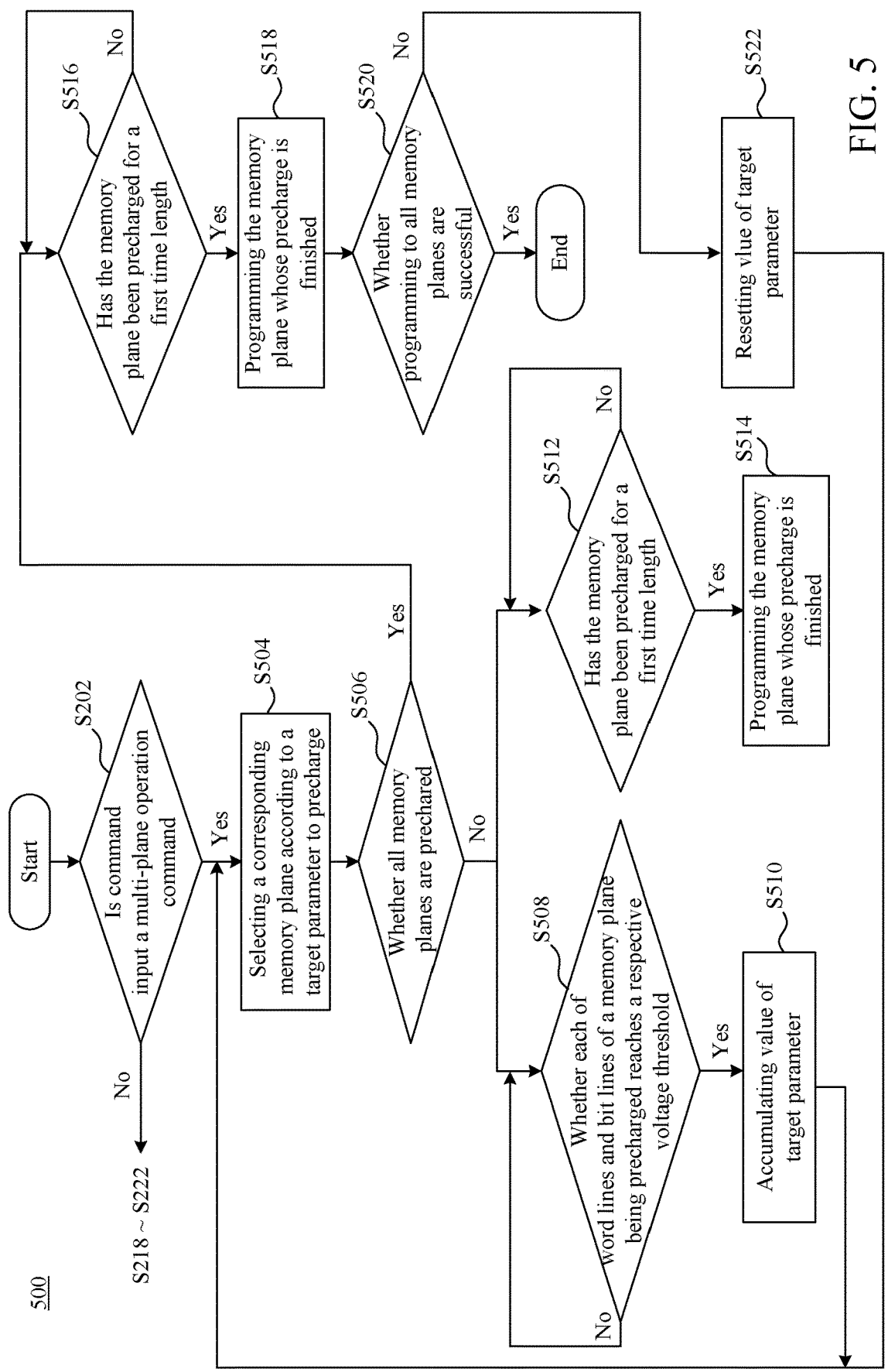
FIG. 5 is a flowchart of a driving method according to another embodiment of the present disclosure.
Figure 6:
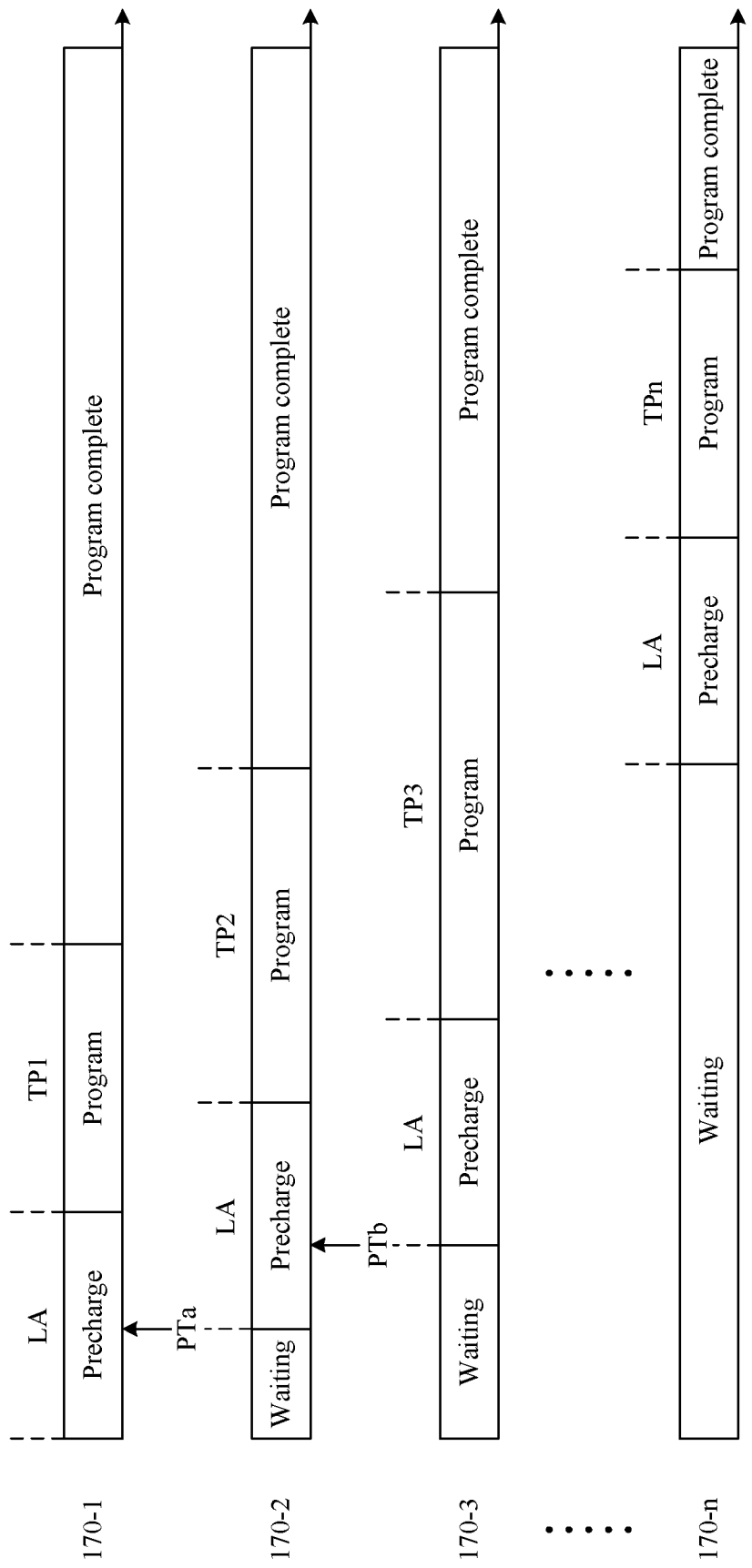
FIG. 6 is a timing diagram for illustrating operations of multiple memory planes according to another embodiment of the present disclosure.

FIG. 5 is a flowchart of a driving method 500 according to another embodiment of the present disclosure. FIG. 6 is a timing diagram for illustrating operations of the memory planes 170-1~170-$n$ according to another embodiment of the present disclosure. Reference is first made to FIG. 5, the nonvolatile memory device 100 may execute the driving method 500 to conduct data operations such as reading, programming, and erasing. For the purpose of explanatory convenience, the driving method 500 will be described with programming operation as an example in the following description. The nonvolatile memory device 100 conducts the aforementioned operation S202, wherein if the command input CI is the multi-plane operation command, the nonvolatile memory device 100 conducts operations S504~S522. On the contrary, the nonvolatile memory device 100 conducts the aforementioned operations S218~S222.

In operation S504, the control circuit 120 selects a corresponding one of the memory planes 170-1~170-$n$ according to a target parameter to precharge at least one word line WL and at least one bit line BL thereof. Then, in operation S506, the control circuit 120 determines whether all of the memory planes 170-1~170-$n$ are precharged. The control circuit 120 may, for example, determine whether the target parameter is smaller than a total number of the memory planes 170-1~170-$n$. If not all of the memory planes 170 are precharged, the nonvolatile memory device 100 conducts operations S508~S514. On the contrary, the nonvolatile memory device 100 conducts operation S516.

In operation S508, the control circuit 120 determines whether the at least one word line WL and the at least one bit line BL of a memory plane 170 currently being precharged (e.g., the memory plane 170-1) reach respective voltage thresholds. For example, the control circuit 120 may determine whether each of the at least one bit line BL reaches a voltage threshold (e.g., 2.8 V) close to the inhibit voltage; the control circuit 120 may also determine whether a word line WL reaches a voltage threshold (e.g., 18 V) close to the programming voltage; the control circuit 120 may further determine whether other word lines WL reach a voltage threshold (e.g., 8 V) close to the passing voltage. If the control circuit 120 determines that the at least one word line WL and the at least one bit line BL of a memory plane 170 currently being precharged reach the respective voltage thresholds, the nonvolatile memory device 100 conducts operation S510. On the contrary, the nonvolatile memory device 100 may conduct operation S508 again.

In operation S510, the control circuit 120 accumulates the target parameter, such as setting the target parameter to the target parameter plus 1. The nonvolatile memory device 100 may conduct operation S504 after operation S510 is finished. In this situation, the control circuit 120 selects other corresponding one of the memory planes 170-1~170-$n$ (e.g., the memory plane 170-2) to precharge at least one word line WL and at least one bit line BL thereof.

When the nonvolatile memory device 100 conducts operations S508~S510 and other operations after operation S510, the nonvolatile memory device 100 may conduct operations S512~S514 simultaneously. Reference is made to FIGS. 5 and 6, in operation S512, the control circuit 120 determines whether the memory plane 170 currently being precharged (e.g., the memory plane 170-1) has been precharged for a first time length LA. When the memory plane 170 currently being precharged has been precharged for the first time length LA, the control circuit 120 determines that the precharge is finished and the nonvolatile memory device 100 then conduct operation S514 to program the at least one memory cell Ce disposed at intersections of the at least one word line WL and the at least one bit line BL of the memory plane 170 whose precharge is finished (e.g., the memory plane 170-1). On the contrary, the nonvolatile memory device 100 may conduct operation S512 again.

As shown in FIG. 6, when the at least one word line WL and the at least one bit line BL of one memory plane 170 (e.g., the memory plane 170-1) reach the respective voltage thresholds at a first time point PTa, the control circuit 120 not only controls the bias arrangement circuit 140 to continue precharging the one memory plane 170, but control circuit 120 also controls the bias arrangement circuit 140 to start to precharge at least one word line WL and at least one bit line BL of a next memory plane 170 (e.g., the memory plane 170-2) without waiting for the precharge of the one memory plane 170 to be complete. Similarly, when the at least one word line WL and the at least one bit line BL of the next memory plane 170 (e.g., the memory plane 170-2) reach the respective voltage threshold at a second time point PTb, the control circuit 120 not only controls the bias arrangement circuit 140 to continue precharging the next memory plane 170, but the control circuit 120 also controls the bias arrangement circuit 140 to start to precharge at least one word line WL and at least one bot line BL of a memory plane 170 (e.g., the memory plane 170-3) subsequent to the next memory plane 170.

When the at least one word line WL and the at least one bit line BL of the memory plane 170 reach the respective voltage thresholds, the precharge process is almost complete. According to charging and discharging characteristics of a capacitor, current provided by the bias arrangement circuit 140 to the memory plane 170 has dropped significantly compared to that of when precharge started. Therefore, even multiple memory planes 170 are precharged at the same time, excessive current surges will not be caused.

As can be appreciated from the foregoing descriptions, when the nonvolatile memory device 100 executes the driving method 500, the memory planes 170-1~170-$n$ are sequentially start being precharged. Therefore, the driving method 500 is helpful to reduce current surges in the nonvolatile memory device 100.

In addition, in a situation that excessive current surges would not be caused, multiple ones of the memory planes 170-1~170-$n$ can be precharged at the same time. Therefore, the driving method 500 is helpful to further accelerate programming speed of the nonvolatile memory device 100.

Reference is made to FIG. 5 again, when the control circuit 120 determines that the target parameter is larger than the total number of the memory planes 170-1~170-$n$ in operation S506, the nonvolatile memory device 100 conduct operation S516 similar to operation S512. When the control circuit 120 determines that the memory plane 170 currently being precharged (e.g., the memory plane 170-$n$) has been precharged for the first time length LA, the control circuit 120 determines that precharged is complete and then conducts operation S518 to program the at least one memory cell of the memory plane 170 whose precharge is finished. On the contrary, the nonvolatile memory device 100 may conduct operation S516 again to precharge the memory plane 170.

Operation S520 is similar to operation S214 of FIG. 2. When the control circuit 120 determines that programming operations to the memory planes 170-1~170-$n$ are all successful, the nonvolatile memory device 100 may finish executing the driving method 500. On the contrary, the nonvolatile memory device 100 may execute operation S522 similar to operation S216 of FIG. 2 to reset value of the target parameter. The nonvolatile memory device 100 may conduct operation S504 again after operation S522 is finished.

Figure 7:
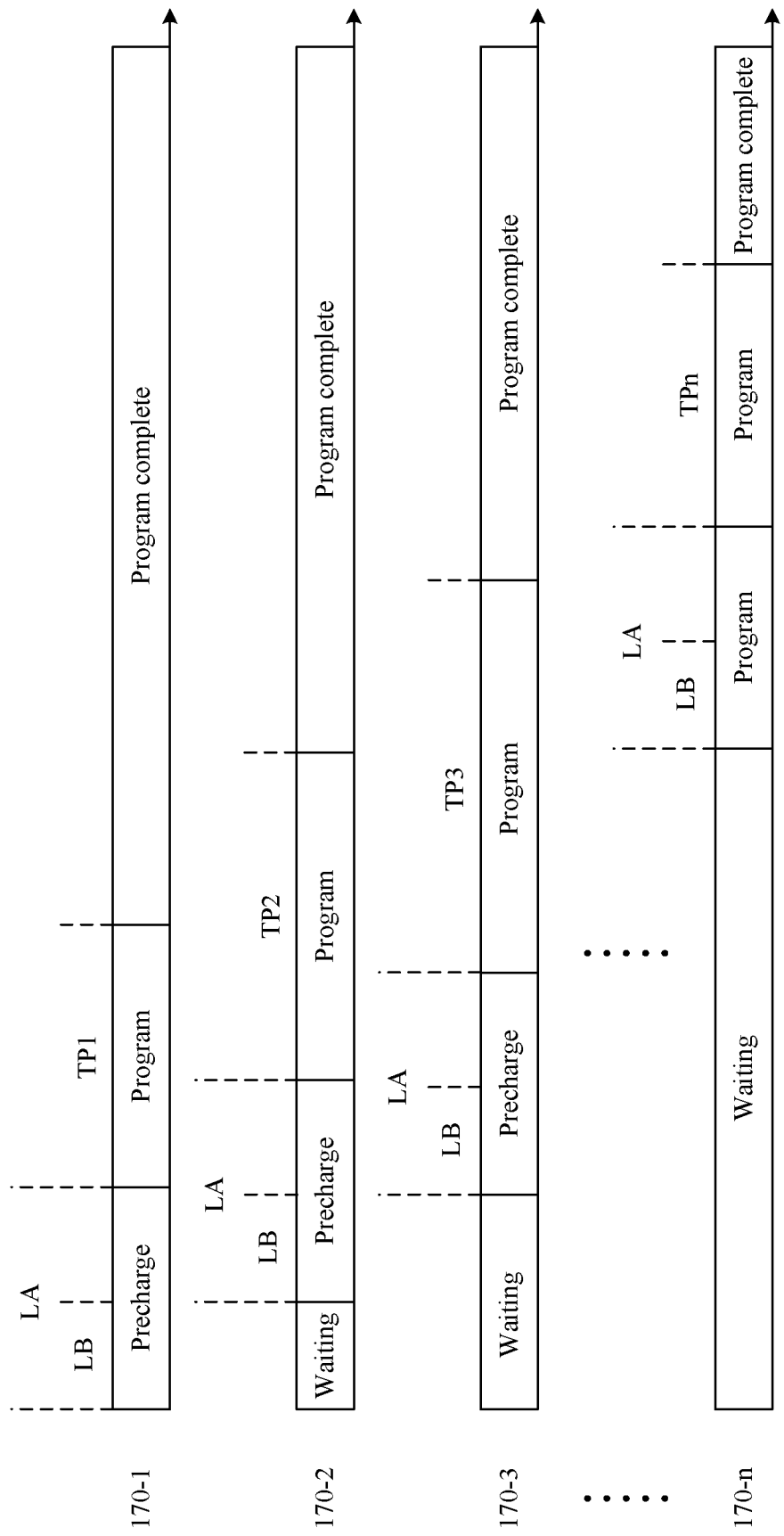
FIG. 7 is a timing diagram for illustrating operations of multiple memory planes according to yet another embodiment of the present disclosure.

In some embodiments, as shown in FIG. 7, the control circuit 120 determines whether the memory plane 170 currently being precharged has been precharged for a second time length LB in operation S508, wherein the aforementioned first time length LA is longer than the second time length LB. When the memory plane 170 currently being precharged has been precharged for the second time length LB, the nonvolatile memory device 100 executes operation S510. On the contrary, the nonvolatile memory device 100 may conduct operation S508 again to continue precharging the memory plane 170. The second time length LB may be stored in the nonvolatile memory device 100 in advance. By selecting a suitable second time length LB, excessive current surges can be prevented even though multiple ones of the memory planes 170-1~170-$n$ are precharged simultaneously.

In other embodiments, when the nonvolatile memory device 100 executes the driving method 500 to read the memory chip MC, the nonvolatile memory device 100 may conduct reading operation in operation S514 and operation S518 rather than conducting programming operation. Similarly, in other embodiments, when the nonvolatile memory device 100 executes the driving method 500 to erase the memory chip MC, the nonvolatile memory device 100 may conduct erasing operation in operation S514 and operation S518 rather than conducting programming operation.

Although FIG. 1 only depicts one memory chip MC, this disclosure is not limited thereto. In practice, the nonvolatile memory device 100 may comprise a plurality of logic units LUN to increase storage density, and the nonvolatile memory device 100 may execute the driving method 200 or 500 for each memory chip MC.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A driving method of a nonvolatile memory device comprising a plurality of memory planes comprises:
    precharging at least one word line and at least one bit line of a first memory plane of the plurality of memory planes;
    if the at least one word line and the at least one bit line of the first memory plane have been precharged for a first time length or to respective voltage thresholds, precharging at least one word line and at least one bit line of a second memory plane of the plurality of memory planes;
    conducting a first data operation to at least one memory cell of the first memory plane, wherein the at least one memory cell of the first memory plane is disposed at intersections of the at least one word line and the at least one bit line of the first memory plane; and
    conducting a second data operation to at least one memory cell of the second memory plane, wherein the at least one memory cell of the second memory plane is disposed at intersections of the at least one word line and the at least one bit line of the second memory plane.

2. The driving method of claim 1, wherein each of the first data operation and the second data operation comprises a programming operation, a reading operation, or an erasing operation.

3. The driving method of claim 1, wherein the first data operation is conducted in a first time period, the second data operation is conducted in a second time period, a start point of the first time period is earlier than a start point of the second time period, and the first time period is at least partially overlapping with the second time period.

4. The driving method of claim 3, wherein in a situation that the at least one word line and the at least one bit line of the first memory plane have been precharged for the first time length, the at least one word line and the at least one bit line of the second memory plane are precharged, and the driving method further comprises:
    if the at least one word line and the at least one bit line of the second memory plane have been precharged for the first time length, precharging at least one word line and at least one bit line of a third memory plane of the plurality of memory planes.

5. The driving method of claim 1, wherein in a situation that the at least one word line and the at least one bit line of the first memory plane have been precharged to the respective voltage thresholds, the at least one word line and the at least one bit line of the second memory plane are precharged while continuing precharging the at least one word line and the at least one bit line of the first memory plane, and the operation of conducting the first data operation to the at least one memory cell of the first memory plane comprises:
    when the at least one word line and the at least one bit line of the first memory plane have been precharged for the first time length, conducting the first data operation to the at least one memory cell of the first memory plane.

6. The driving method of claim 5, further comprising:
    if the at least one word line and the at least one bit line of the second memory plane have been precharged to respective voltage thresholds, precharging at least one word line and at least one bit line of a third memory plane of the plurality of memory planes while continuing precharging the at least one word line and the at least one bit line of the second memory plane,
    wherein the operation of conducting the second data operation to the at least one memory cell of the second memory plane comprises:
        when the at least one word line and the at least one bit line of the second memory plane have been precharged for the first time length, conducting the second data operation to the at least one memory cell of the second memory plane.

7. The driving method of claim 1, wherein when precharging the at least one word line and the at least one bit line of the first memory plane, the at least one word line and the at least one bit line of the first memory plane have stepped voltage waveforms.

8. A driving method of a nonvolatile memory device comprising a plurality of memory planes comprises:
    precharging at least one word line and at least one bit line of a first memory plane of the plurality of memory planes;
    if the at least one word line and the at least one bit line of the first memory plane have been precharged for a second time length shorter than a first time length, precharging at least one word line and at least one bit line of a second memory plane of the plurality of memory planes while continuing precharging the at least one word line and the at least one bit line of the first memory plane;
    when the at least one word line and the at least one bit line of the first memory plane have been precharged for the first time length, conducting a first data operation to at least one memory cell of the first memory plane, wherein the at least one memory cell of the first memory plane is disposed at intersections of the at least one word line and the at least one bit line of the first memory plane; and when the at least one word line and the at least one bit line of the second memory plane have been precharged for the first time length, conducting a second data operation to at least one memory cell of the second memory plane, wherein the at least one memory cell of the second memory plane is disposed at intersections of the at least one word line and the at least one bit line of the second memory plane.

9. The driving method of claim 8, wherein the first data operation is conducted in a first time period, the second data operation is conducted in a second time period, a start point of the first time period is earlier than the a start point of the second time period, and the first time period is at least partially overlapping with the second time period.

10. The driving method of claim 9, further comprising:
If the at least one word line and the at least one bit line of the second memory plane have been precharged for the second time length, precharging at least one word line and at least one bit line of a third memory plane of the plurality of memory planes while continuing precharging the at least one word line and the at least one bit line of the second memory plane.

11. The driving method of claim 8, wherein when precharging the at least one word line and the at least one bit line of the first memory plane, the at least one word line and the at least one bit line of the first memory plane have stepped voltage waveforms.

12. A nonvolatile memory device, comprising:
a memory chip, comprising a plurality of memory planes; and
a control circuit, coupled with the memory chip, and being adapted to:
precharge at least one word line and at least one bit line of a first memory plane of the plurality of memory planes;
if the at least one word line and the at least one bit line of the first memory plane have been precharged for a first time length or to respective voltage thresholds, precharge at least one word line and at least one bit line of a second memory plane of the plurality of memory planes;
conduct a first data operation to at least one memory cell of the first memory plane, wherein the at least one memory cell of the first memory plane is disposed at intersections of the at least one word line and the at least one bit line of the first memory plane; and
conduct a second data operation to at least one memory cell of the second memory plane, wherein the at least one memory cell of the second memory plane is disposed at intersections of the at least one word line and the at least one bit line of the second memory plane.

13. The nonvolatile memory device of claim 12, wherein each of the first data operation and the second data operation comprises a programming operation, a reading operation, or an erasing operation.

14. The nonvolatile memory device of claim 12, wherein the first data operation is conducted in a first time period, the second data operation is conducted in a second time period, a start point of the first time period is earlier than a start point of the second time period, and the first time period is at least partially overlapping with the second time period.

15. The nonvolatile memory device of claim 14, wherein in a situation that the at least one word line and the at least one bit line of the first memory plane have been precharged for the first time length, the control circuit precharges the at least one word line and the at least one bit line of the second memory plane, and the control circuit is further adapted to:
if the at least one word line and the at least one bit line of the second memory plane have been precharged for the first time length, precharge at least one word line and at least one bit line of a third memory plane of the plurality of memory planes.

16. The nonvolatile memory device of claim 12, wherein in a situation that the at least one word line and the at least one bit line of the first memory plane have been precharged to the respective voltage thresholds, the control circuit precharges the at least one word line and the at least one bit line of the second memory plane while continuing precharging the at least one word line and the at least one bit line of the first memory plane,
when the at least one word line and the at least one bit line of the first memory plane have been precharged for the first time length, the control circuit conducts the first data operation to the at least one memory cell of the first memory plane.

17. The nonvolatile memory device of claim 16, wherein if the at least one word line and the at least one bit line of the second memory plane have been precharged to respective voltage thresholds, the control circuit precharges at least one word line and at least one bit line of a third memory plane of the plurality of memory planes while continuing precharging the at least one word line and the at least one bit line of the second memory plane,
when the at least one word line and the at least one bit line of the second memory plane have been precharged for the first time length, the control circuit conducts the second data operation to the at least one memory cell of the second memory plane.

18. The nonvolatile memory device of claim 12, wherein when the control circuit precharges the at least one word line and the at least one bit line of the first memory plane, the at least one word line and the at least one bit line of the first memory plane have stepped voltage waveforms.

* * * * *